(12) United States Patent
Jiang

(10) Patent No.: US 6,239,489 B1
(45) Date of Patent: May 29, 2001

(54) REINFORCEMENT OF LEAD BONDING IN MICROELECTRONICS PACKAGES

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/365,599

(22) Filed: Jul. 30, 1999

(51) Int. Cl.$^7$ .................................................. H01L 23/48

(52) U.S. Cl. ..................... 257/738; 257/669; 257/676; 257/690; 257/778

(58) Field of Search .................................. 257/678, 669, 257/674, 676, 778, 723, 724, 725, 697, 692, 684, 690, 737, 738

(56) References Cited

U.S. PATENT DOCUMENTS

| | | | |
|---|---|---|---|
| 5,148,265 | * 9/1992 | Khandros et al. | 257/773 |
| 5,148,266 | * 9/1992 | Khandros et al. | 257/669 |
| 5,619,065 | * 4/1997 | Kim | 257/674 |
| 5,663,106 | * 9/1997 | Karavakis et al. | 29/841 |
| 5,757,068 | * 5/1998 | Kata et al. | 257/668 |
| 5,801,446 | * 9/1998 | DiStefano et al. | 257/778 |
| 5,821,608 | * 10/1998 | DiStefano et al. | 257/669 |
| 5,886,415 | * 3/1999 | Akagawa | 257/790 |
| 5,990,563 | * 11/1999 | Kim | 257/687 |
| 6,028,354 | * 2/2000 | Hoffman | 257/706 |
| 6,049,128 | * 4/2000 | Kitano et al. | 257/737 |

FOREIGN PATENT DOCUMENTS 9-260533 * 10/1997 (JP).

* cited by examiner

Primary Examiner—Olik Chaudhuri
Assistant Examiner—Alonzo Chambliss
(74) Attorney, Agent, or Firm—Dorsey & Whitney LLP

(57) ABSTRACT

The present invention is directed toward an apparatus and method of reinforcement of lead bonding in microelectronics packages. In one embodiment, a microelectronics package includes a microelectronics device having a bond pad, a conductive lead having a first end bonded to the bond pad to form a lead bond, an encapsulating material at least partially disposed about the conductive lead, and a reinforcement portion at least partially disposed about the lead bond and at least partially coupling the first end to the bond pad. The reinforcement portion has a greater modulus of elasticity and/or a greater bond strength than the encapsulating material. During thermal cycling of the microelectronics package, bond liftoff due to CTE mismatch is prevented by the reinforcement portion. The reinforcement portion may include a non-conductive adhesive material that physically secures the conductive lead to the bond pad, or alternately, an electrically conductive adhesive material that both physically and/or electrically couples the conductive lead to the bond pad. In an alternate embodiment, a microelectronics package includes a microelectronics device, an interposer, a plurality of conductive leads and a plurality of bond pads, and the reinforcement portion is disposed about a plurality of lead bonds. In this embodiment, the reinforcement portion may include a non-conductive adhesive material, or an anisotropically conductive material.

39 Claims, 2 Drawing Sheets

REINFORCEMENT OF LEAD BONDING IN MICROELECTRONICS PACKAGES

TECHNICAL FIELD

The present invention relates to apparatus and methods of reinforcement of lead bonding in microelectronics packages.

BACKGROUND OF THE INVENTION

Microelectronics packages are required to operate under a variety of conditions, including repetitive or cyclical variations in the temperature of the operating environment. Typically, quality assurance testing of microelectronics packages involves subjecting the packages to repetitive thermal cycling during a procedure known as "burn in" testing. As the trend toward decreasing the size of microelectronic packages continues, the problems associated with repetitive thermal cycling during testing and operation become more pronounced.

FIG. 1 is a partial cross-sectional elevational view of a portion of a micro-ball grid array (micro-BGA) package 10 in accordance with the prior art. The micro-BGA package 10 includes a die 12 having a plurality of bond pads 14 formed thereon. The micro-BGA package 10 also includes an interposer (or lead frame) 16 having a dielectric substrate 18 with a plurality of contact pads 20 formed thereon.

A spacing layer 22 is disposed between the die 12 and the interposer 16, and a plurality of conductive leads 24 coupled between the die 12 to the interposer 16. Each conductive lead 24 has a first end 26 bonded to one of the bond pads 14 and a second end 28 bonded to one of the contact pads 20, thereby electrically coupling the die 12 to the interposer 16. An encapsulating material 30 is disposed over the conductive leads 24 and the exposed areas of the die 12 to seal and protect the fragile conductive leads 24 and circuitry of the die 12 from the environment. Finally, a conductive bump 32 is formed on each of the contact pads 20. Micro-BGA packages of the type shown in FIG. 1, and methods of forming such packages, are shown and described, for example, in U.S. Pat. Nos. 5,663,106 and 5,777,379 to Karavakis et al, and in U.S. Pat. No. 5,821,608 to DiStefano et al, which are incorporated herein by reference.

Typically, the bond pads 14 may be formed of aluminum or other suitable electrically-conductive material while the die 12 is primarily composed of silicon. The dielectric substrate 18 of the interposer 16 may be a molded plastic or ceramic material, and the contact pads 20 may be aluminum or other suitable metallic material. Gold wires are typically used for the conductive leads 24. Due to the significant differences in the coefficient of thermal expansion (CTE) of these materials, significant mechanical stresses may develop in the micro-BGA package 10 due to the CTE mismatch of these components as the package is subjected to a range of temperatures during testing or in operation.

One prominent problem attributable to the differences in CTE of the components of the micro-BGA package is detachment of the first end 26 of the conductive lead 24 from the bond pad 14 of the die 12. Because the interposer 16 and die 12 have different CTE, temperature fluctuations cause mechanical stresses to develop along and within the bond between the first end 26 and the bond pad 14. After repeated thermal cycling, the bond fatigues and the first end 26 of the conductive lead 24 becomes detached from the bond pad 14. The problem of detachment of the conductive lead 24 from the bond pad 14 is commonly referred to as "bond liftoff."

Efforts have been made to prevent bond liftoff of the first end 26 of the conductive lead 24 from the bond pad 14. For example, as described in U.S. Pat. No. 5,821,608, the conductive leads 24 may have a laterally curved or expandable middle section 27 (FIG. 1) that allows the conductive lead 24 to flex and bend slightly during thermal cycling, thereby reducing the mechanical stress on the solder interface. As the micro-BGA package 10 is heated or cooled, the relative movement of the components due to CTE mismatch is taken up by the flexible, bendable middle section 27, preventing stresses from building up in the bond between the bond pad 14 and the first end 26.

Also, the spacing layer 22 may be formed of a complaint or elastomer material that further reduces the stress on the solder interface due to CTE mismatch between the interposer 16 and the die 12, as disclosed in U.S. Pat. Nos. 5,148,265 and 5,148,266, which are incorporated herein by reference. The flexibility of the spacing layer 22 allows relative movement between the die 12 and the interposer 16 during thermal cycling, preventing the development of stresses induced by the CTE mismatch.

To permit the desired flexure of the conductive leads 24 or the spacing layer 22 in the above-described micro-BGA packages 10, the encapsulating material 30 is composed of a material having a low modulus of elasticity, a low bond strength, a high CTE, and a low glass transition temperature. The glass transition temperature ($T_G$) of a material is the temperature at which an amorphous polymeric material changes from a hard, relatively brittle condition to a soft, relatively rubbery condition. Thus, in the above-described prior art packages, the encapsulating material 30 is typically composed of a soft, compliant polymeric material, such as silicone rubber or other castable elastomer, having a modulus of elasticity typically from about 400 psi to about 800 psi, a CTE from about 100 to about 300 ppm/° C., and $T_G$ from about −120 to about 10° C.

These efforts, however, have not been completely effective in preventing bond liftoff of the conductive leads 24 from the bond pads 14 during repeated thermal cycling or due to other sources of stress.

SUMMARY OF THE INVENTION

The present invention relates to an apparatus and method of reinforcement of lead bonding in microelectronics packages. In one aspect of the invention, a microelectronics package includes a microelectronics device having a bond pad, a conductive lead having a first end bonded to the bond pad, an encapsulating material at least partially disposed about the conductive lead, and a reinforcement portion at least partially disposed about the lead bond and at least partially coupling the first end to the bond pad, the reinforcement portion having a greater bond strength and a greater modulus of elasticity than the encapsulating material. During thermal cycling of the microelectronics package, bond liftoff due to CTE mismatch is prevented by the reinforcement portion, which supports the bond between the conductive lead and the bond pad.

In another aspect of the invention, the reinforcement portion comprises a non-conductive adhesive material that physically secures the conductive lead to the bond pad. Alternately, the reinforcement portion comprises an electrically conductive adhesive material that both physically and/or electrically couples the conductive lead to the bond pad.

In yet another aspect of the invention, a microelectronics package includes a plurality of conductive leads and bond pads, and the reinforcement portion is at least partially disposed about a plurality of lead bonds. In this aspect, the reinforcement portion may comprises a non-conductive adhesive material, or an anisotropically conductive material.

DETAILED DESCRIPTION OF THE INVENTION

The following description is generally directed toward apparatus and methods of reinforcement of lead bonding in microelectronics packages. Many specific details of certain embodiments of the invention are set forth in the following description and in FIGS. 2–4 to provide a thorough understanding of such embodiments. One skilled in the art, however, will understand that the present invention may have additional embodiments, or that the present invention may be practiced without several of the details described in the following description.

Figure 1:
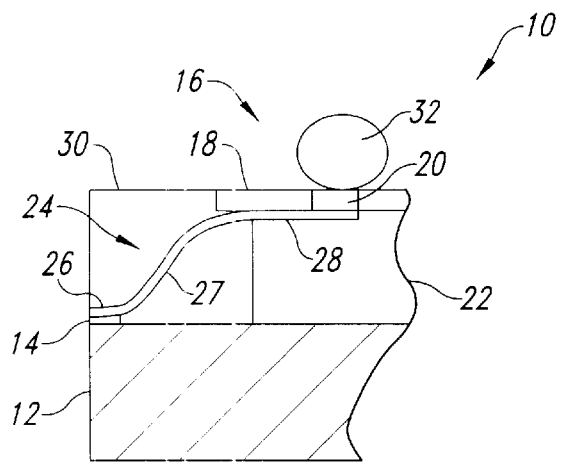
FIG. 1 is a partial cross-sectional elevational view of a portion of micro-ball grid array package in accordance with the prior art.
Figure 2:
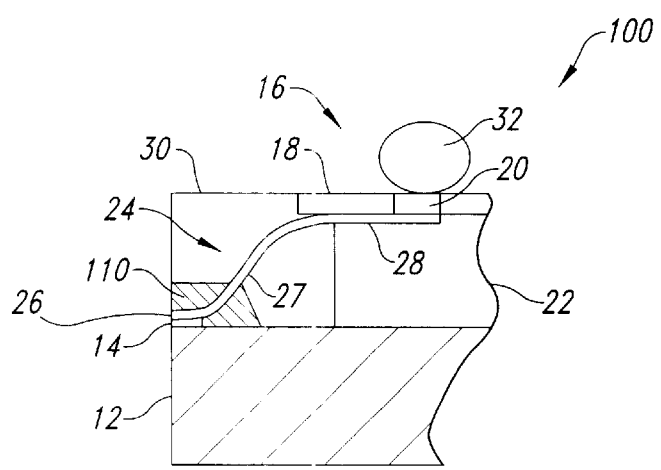
FIG. 2 is a partial cross-sectional elevational view of a portion of micro-ball grid array package in accordance with an embodiment of the invention.

FIG. 2 is a partial cross-sectional elevational view of a portion of a micro-ball grid array package 100 in accordance with an embodiment of the invention. The micro-BGA package 100 includes a die 12 having a plurality of bond pads 14 formed thereon, and an interposer (or lead frame) 16 having a dielectric substrate 18 with a plurality of contact pads 20 formed thereon. As in the conventional packages described above, the micro-BGA package 100 includes a spacing layer 22 disposed between the die 12 and the interposer 16, and a plurality of conductive leads 24 which electrically couple the die 12 to the interposer 16. Each conductive lead 24 has a first end 26 bonded to one of the bond pads 14 in any conventional manner (e.g. solder, thermal bonding, ultrasonic bonding, etc.). The conductive lead 24 has a second end 28 bonded to one of the contact pads 20, and may also include a flexible (or expandable) middle section 27.

The micro-BGA package 100 also includes a reinforcement portion 110 at least partially disposed about the first end 26 of the conductive lead 24 and about the bond pad 14. An encapsulating material 30 is disposed at least partially about the reinforcement portion 110, and over the conductive leads 24 and the exposed areas of the die 12. Finally, a conductive bump 32 is formed on each of the contact pads 20.

Figure 3:
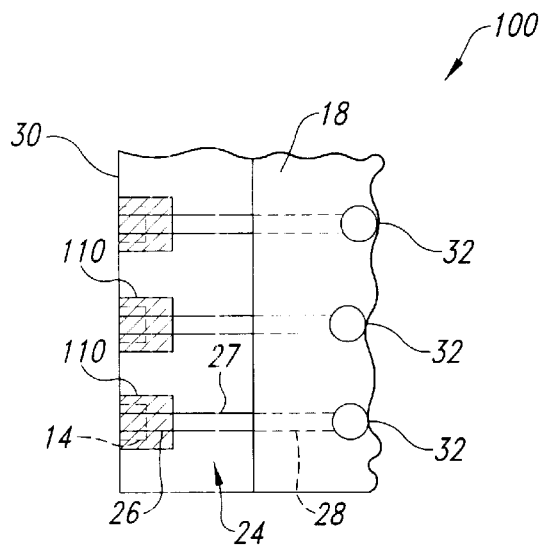
FIG. 3 is a partial top elevational view of the micro-ball grid ray package of FIG. 2.

FIG. 3 is a partial top elevational view of the micro-BGA package 100 of FIG. 2. As shown in this view, each of the bonded connections between the first ends 26 of the conductive leads 24 and the bond pads 14 of the die 12 is enclosed within its own individual reinforcement portion 110. Thus, each reinforcement portion 110 supports the bond between the conductive lead 24 to the bond pad 14, and at least partially secures the first end 26 to the bond pad 14.

The reinforcement portion 110 is composed of an adhesive material characterized by a higher modulus of elasticity and/or a greater bond strength relative to the materials utilized for the encapsulating material 30. Generally, such adhesive materials may also be characterized as having relatively low CTE and high $T_G$. Suitable adhesive materials for the reinforcement portion 110 typically have a modulus of elasticity from about 10,000 psi to about 1,000,000 psi. These materials may also have a CTE from about 20 to about 50 ppm/° C., and $T_G$ from about 50 to about 150° C., although materials having properties outside these ranges may be suitable. Representative materials suitable for the reinforcement portion include, for example, the electrically non-conductive adhesive QMI 536 available from Quantum Material, Inc. of San Diego, Calif., having a modulus of elasticity of approximately 38,450 psi, or the electrically conductive adhesive Ablestik 8360 sold by Ablestick US of Rancho Dominguez, Calif., having a modulus of elasticity of approximately 720,000 psi. The bond strength (i.e. force necessary to pull first end 26 from bond pad 14) can be enhanced from below 10 g without the reinforcement portion 110 to above 100 g with the addition of the reinforcement portion 110.

During thermal cycling of the micro-BGA package 100, the CTE mismatch of the various components of package causes flexure of the middle section 27 of the conductive lead 24, and flexure of the compliant spacing layer 22. The low modulus encapsulating material 30 accommodates the flexing and bending of the conductive lead 24 and the spacing layer 22. The reinforcement portion 110, however, remains relatively rigid during the thermal cycling, thereby providing support and relieving stress at the connection between the bond pad 14 and the conductive lead 24. The reinforcement portion 110 also provides additional bonding strength to the connection. The high modulus reinforcement portion 110 prevents fatigue at the interface between the conductive lead 24 and the bond pad 14, and reduces or eliminates bond liftoff during repeated thermal cycling of the package 100.

As previously indicated, for the embodiment depicted in FIG. 3, both conductive and non-conductive adhesive materials may be used to form the reinforcement portion 110. Both types of materials may advantageously maintain the desired physical contact between the conductive lead 24 and the bond pad 14 during repetitive thermal cycling of the micro-BGA package 100, preventing bond liftoff due to CTE mismatch. In the event that physical contact between the conductive lead 24 and the bond pad 14 is not maintained, however, those adhesive materials which are electrically conductive may serve to maintain the desired electrical connection between the conductive lead 24 and the bond pad 14. Thus, the reinforcement portion 110 composed of a conductive adhesive material advantageously provides an alternate method of preventing failure of the micro-BGA package 100.

Although the reinforcement portions 110 are shown in FIGS. 2 and 3 as being approximately polygonal and uniform in shape, the reinforcement portions 110 may be formed in any suitable shape and may vary in size and shape at different locations on the micro-BGA package 100. The actual sizes and shapes of the reinforcement portions 110 may vary depending upon several variables, including the application or fabrication processes, the bonding characteristics of the materials used, and the anticipated stresses and operational environments of the micro-BGA package 100. Furthermore, the size of the reinforcement portion 110 may be reduced so that only a portion of the first end 26 and bond pad 14 are disposed within the reinforcement portion 110, or may be increased to include the entire bond pad 14, the first end 26, and also a part of the flexible middle section 27 as necessary or desirable.

Figure 4:
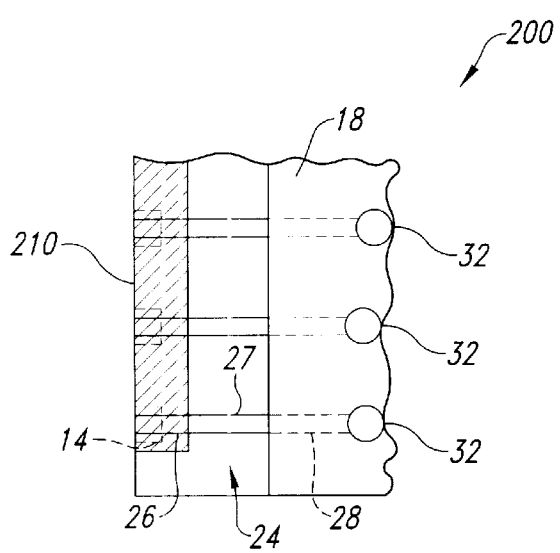
FIG. 4 is a partial top elevational view of a micro-ball grid array ckage in accordance with an alternate embodiment of the invention.

FIG. 4 is a partial top elevational view of a micro-BGA package 200 in accordance with an alternate embodiment of the invention. In this embodiment, the micro-BGA package 200 includes a single reinforcement portion 210 disposed over a plurality of conductive lead 24 and bond pad 14 connections. The reinforcement portion 210 supports the connections between the conductive leads 24 and the bond pads 14 as described above, and at least partially bonds the first ends 26 to the bond pads 14, preventing bond liftoff.

One may note that the variety of materials which may be used to form the reinforcement portion 210 is more limited than in the previously described embodiment. Specifically, those materials which are isotropically electrically conductive may not be used because of the possibility of electrical shorting through the reinforcement portion 210. Generally, the materials which are suitable for forming the reinforcement portion 210 include non-conductive adhesive materials, or materials that are anisotropically conductive, i.e. conductive in only a single direction. Suitable anisotropically conductive adhesives include the so-called "z-axis" conductive adhesives available from A.I. Technology, Inc. of Trenton, N.J.

The micro-BGA package 200 having the single reinforcement portion 210 allows some or all of the first ends 26 of the conductive leads 24 to be bonded to the bond pads 14 of the die 12 using a single "gang-bonding" or multiple-bonding process. This may advantageously simplify the fabrication process of the micro-BGA package 200 over the alternate embodiment having individual reinforcement portions 110 disposed about each connection (FIG. 3) which may require more precise, time-consuming application of each individual reinforcement portion 110. Thus, micro-BGA package 200 having the single reinforcement portion 210 may reduce fabrication time and cost.

Although the apparatus and methods of reinforcement of lead bonding in microelectronics packages have been shown and described above with specific reference to micro-BGA packages, one may note that the apparatus and methods disclosed herein are applicable to any type of microelectronics package having one or more conductive leads bonded to bond pads. Bond liftoff may occur in any such microelectronics package, and is not caused solely by CTE mismatch during repetitive thermal cycling. Thus, the apparatus and methods of reinforcement of lead bonding disclosed herein may be applied to a wide variety of microelectronics packages and devices.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part with prior art apparatus and methods to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein of the invention can be applied to other apparatus and methods of reinforcement of lead bonding in microelectronics packages, and not just to the apparatus and methods described above and shown in the figures. In general, in the following claims, the terms used should not be construed to limit the invention to the specific embodiments disclosed in the specification and the claims, but should be construed to include all apparatus and methods of reinforcement of lead bonding in microelectronics packages that operate within the broad scope of the claims. Accordingly, the invention is not limited by the foregoing disclosure, but instead its scope is to be determined by the following claims.

What is claimed is:

1. A microelectronics package, comprising:
   a microelectronics device having a bond pad;
   an elongated conductive lead having a first end directly bonded to the bond pad to form a lead bond;
   a reinforcement portion at least partially disposed about the lead bond and a first portion of the conductive lead proximate to the first end, wherein the first end and the bond pad are substantially encapsulated by the reinforcement portion; and
   an encapsulating material at least partially disposed about the reinforcement portion and a second portion of the conductive lead, the second portion not having the reinforcement portion disposed thereabout,
   the reinforcement portion having a greater modulus of elasticity than the encapsulating material.

2. The microelectronics package of claim 1 wherein the reinforcement portion has a greater bond strength than the encapsulating material.

3. The microelectronics package of claim 1 wherein the reinforcement portion comprises an electrically non-conductive material.

4. The microelectronics package of claim 1 wherein the reinforcement portion comprises an electrically conductive material.

5. The microelectronics package of claim 4 wherein the electrically conductive material comprises an anisotropically conductive material.

6. The microelectronics package of claim 1 wherein the conductive lead includes a flexible portion proximate the first end, the encapsulating material being at least partially disposed about the flexible portion.

7. The microelectronics package of claim 6 wherein the reinforcement portion is at least partially disposed about the flexible portion.

8. The microelectronics package of claim 1 wherein the encapsulating material comprises an elastomer material.

9. The microelectronics package of claim 1 wherein the microelectronics device comprises a die.

10. The microelectronics package of claim 1 wherein the first end of the conductive lead is ultrasonically bonded to the bond pad.

11. The microelectronics package of claim 1 wherein the first end is thermally bonded to the bond pad.

12. The microelectronics package of claim 1 wherein the first end is soldered to the bond pad.

13. The microelectronics package of claim 1, further comprising a lead frame having a contact pad, the conductive lead having a second end electrically coupled to the contact pad.

14. The microelectronics package of claim 13, further comprising a conductive bump formed on the contact pad.

15. The microelectronics package of claim 13, further comprising a spacing layer having a first surface in contact with the microelectronics device and a second surface substantially opposite the first surface that is in contact with the lead frame.

16. A microelectronics package, comprising:

a microelectronics device having a bond pad;

a conductive lead having a first end directly bonded to the bond pad to form a lead bond;

a reinforcement portion at least partially disposed about the lead bond and a first portion of the conductive lead proximate to the first end, wherein the first end and the bond pad are substantially encapsulated by the reinforcement portion; and an encapsulating material at least partially disposed about the reinforcement portion and a second portion of the conductive lead not having the reinforcement portion disposed thereabout, the reinforcement portion having a greater bond strength than the encapsulating material.

17. The microelectronics package of claim 16 wherein the reinforcement portion has a greater modulus of elasticity than the encapsulating material.

18. The microelectronics package of claim 16 wherein the reinforcement portion comprises an electrically non-conductive material.

19. The microelectronics package of claim 16 wherein the reinforcement portion comprises an electrically conductive material.

20. The microelectronics package of claim 19 wherein the electrically conductive material comprises an anisotropically conductive material.

21. The microelectronics package of claim 16 wherein the conductive lead includes a flexible portion proximate the first end, the encapsulating material being at least partially disposed about the flexible portion.

22. The microelectronics package of claim 21 wherein the reinforcement portion is at least partially disposed about the flexible portion.

23. The microelectronics package of claim 16 wherein the encapsulating material comprises an elastomer material.

24. The microelectronics package of claim 16, further comprising a lead frame having a contact pad, the conductive lead having a second end electrically coupled to the contact pad.

25. The microelectronics package of claim 24, further comprising a spacing layer having a first surface in contact with the microelectronics device and a second surface substantially opposite the first surface that is in contact with the lead frame.

26. A microelectronics package, comprising:

a microelectronics device having a plurality of bond pads;

a plurality of conductive leads each having a first end directly bonded to one of the bond pads to form a plurality of lead bonds;

an interposer having a plurality of contact pads, each conductive lead having a second end electrically coupled to one of the contact pads;

a spacing layer having a first surface contacting the microelectronics device and a second surface substantially opposite the first surface and contacting the interposer;

a reinforcement portion at least partially disposed about the lead bond pads and a first portion of the conductive leads proximate to the first end; and an encapsulating material at least partially disposed about the reinforcement portion and a second portion of the conductive leads not having the reinforcement portion disposed thereabout, the reinforcement portion having a greater modulus of elasticity than the encapsulating material.

27. The microelectronics package of claim 26 wherein the reinforcement portion has a greater bond strength than the encapsulating material.

28. The microelectronics package of claim 26 wherein the reinforcement portion comprises an electrically non-conductive material.

29. The microelectronics package of claim 26 wherein the reinforcement portion comprises an anisotropically conductive material.

30. The microelectronics package of claim 26 wherein at least one conductive lead includes a flexible portion proximate the first end, the encapsulating material being at least partially disposed about the flexible portion.

31. The microelectronics package of claim 30 wherein the reinforcement portion is at least partially disposed about the flexible portion.

32. The microelectronics package of claim 26, further comprising a plurality of conductive bumps formed on the contact pads.

33. A microelectronics package, comprising:

a microelectronics device having a plurality of bond pads;

a plurality of conductive leads each having a first end directly bonded to one of the bond pads to form a plurality of lead bonds;

an interposer having a plurality of contact pads, each conductive lead having a second end electrically coupled to one of the contact pads;

a spacing layer having a first surface contacting the microelectronics device and a second surface substantially opposite the first surface and contacting the interposer;

a reinforcement portion at least partially disposed about the lead bond pads and a first portion of the conductive leads proximate to the first end, wherein the first end and the bond pad are substantially encapsulated by the reinforcement portion; and an encapsulating material at least partially disposed about the reinforcement portion and a second portion of the conductive leads not having the reinforcement portion disposed thereabout, the reinforcement portion having a greater bond strength than the encapsulating material.

34. The microelectronics package of claim 33 wherein the reinforcement portion has a greater modulus of elasticity than the encapsulating material.

35. The microelectronics package of claim 33 wherein the reinforcement portion comprises an electrically non-conductive material.

36. The microelectronics package of claim 33 wherein the reinforcement portion comprises an anisotropically conductive material.

37. The microelectronics package of claim 33 wherein at least one conductive lead includes a flexible portion proximate the first end, the encapsulating material being at least partially disposed about the flexible portion.

38. The microelectronics package of claim 37 wherein the reinforcement portion is at least partially disposed about the flexible portion.

39. The microelectronics package of claim 33, further comprising a plurality of conductive bumps formed on the contact pads.

* * * * *

UNITED STATES PATENT AND TRADEMARK OFFICE
CERTIFICATE OF CORRECTION

PATENT NO. : 6,239,489 B1 Page 1 of 1
APPLICATION NO. : 09/365599
DATED : May 29, 2001
INVENTOR(S) : Tongbi Jiang It is certified that error appears in the above-identified patent and that said Letters Patent is hereby corrected as shown below:

Column 7, Line 62, after "first end", please insert --, wherein the first end and the bond pad are substantially encapsulated by the reinforcement portion--

Signed and Sealed this

Thirty-first Day of July, 2007

JON W. DUDAS
*Director of the United States Patent and Trademark Office*